(12) United States Patent
Chi et al.

(10) Patent No.: US 9,064,859 B2
(45) Date of Patent: Jun. 23, 2015

(54) SEMICONDUCTOR DEVICE AND METHOD OF FORMING CONDUCTIVE POSTS AND HEAT SINK OVER SEMICONDUCTOR DIE USING LEADFRAME

(71) Applicant: STATS ChipPAC, Ltd., Singapore (SG)

(72) Inventors: HeeJo Chi, Kyoungki-do (KR); NamJu Cho, Gyeonggi-do (KR); HanGil Shin, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/683,946

(22) Filed: Nov. 21, 2012

(65) Prior Publication Data

US 2013/0105970 A1    May 2, 2013

Related U.S. Application Data

(63) Continuation of application No. 12/787,973, filed on May 26, 2010, now Pat. No. 8,349,658.

(51) Int. Cl.
*H01L 23/28* (2006.01)
*H01L 21/58* (2006.01)
(Continued)

(52) U.S. Cl.
CPC ...... *H01L 23/49816* (2013.01); *H01L 21/4832* (2013.01); *H01L 21/561* (2013.01); *H01L 23/3128* (2013.01); *H01L 23/367* (2013.01); *H01L 23/4334* (2013.01); *H01L 23/49524* (2013.01); *H01L 23/49827* (2013.01); *H01L 23/5389* (2013.01); *H01L 24/16* (2013.01); *H01L 24/19* (2013.01); *H01L 24/20* (2013.01); *H01L 24/29* (2013.01); *H01L 24/32* (2013.01); *H01L 24/73* (2013.01); *H01L 24/97* (2013.01); *H01L 25/105* (2013.01); *H01L 2224/12105* (2013.01); *H01L 2224/16227* (2013.01); *H01L 2224/24227* (2013.01); *H01L 2224/29099* (2013.01); *H01L 2224/32245* (2013.01); *H01L 2224/73253* (2013.01); *H01L 2224/73267* (2013.01); *H01L 2224/97* (2013.01); *H01L 2225/1023* (2013.01); *H01L 2225/1035* (2013.01); *H01L 2225/1058* (2013.01);
(Continued)

(58) Field of Classification Search
USPC ........................................................ 438/122
See application file for complete search history.

(56) References Cited

U.S. PATENT DOCUMENTS 5,250,843 A    10/1993    Eichelberger
5,353,498 A    10/1994    Fillion et al.
(Continued)

*Primary Examiner* — Stephen W Smoot
(74) *Attorney, Agent, or Firm* — Robert D. Atkins; Patent Law Group: Atkins and Associates, P.C.

(57) ABSTRACT

A semiconductor device has a prefabricated multi-die leadframe with a base and integrated raised die paddle and a plurality of bodies extending from the base. A thermal interface layer is formed over a back surface of a semiconductor die or top surface of the raised die paddle. The semiconductor die is mounted over the raised die paddle between the bodies of the leadframe with the TIM disposed between the die and raised die paddle. An encapsulant is deposited over the leadframe and semiconductor die. Vias can be formed in the encapsulant. An interconnect structure is formed over the leadframe, semiconductor die, and encapsulant, including into the vias. The base is removed to separate the bodies from the raised die paddle. The raised die paddle provides heat dissipation for the semiconductor die. The bodies are electrically connected to the interconnect structure. The bodies operate as conductive posts for electrical interconnect.

26 Claims, 11 Drawing Sheets

(51) Int. Cl.
  *H01L 23/498* (2006.01)
  *H01L 21/48* (2006.01)
  *H01L 21/56* (2006.01)
  *H01L 23/433* (2006.01)
  *H01L 23/495* (2006.01)
  *H01L 23/538* (2006.01)
  *H01L 23/34* (2006.01)
  *H01L 23/31* (2006.01)
  *H01L 23/367* (2006.01)
  *H01L 23/00* (2006.01)
  *H01L 25/10* (2006.01)

(52) U.S. Cl.
  CPC .............. *H01L2924/01013* (2013.01); *H01L 2924/01029* (2013.01); *H01L 2924/0103* (2013.01); *H01L 2924/01047* (2013.01); *H01L 2924/01073* (2013.01); *H01L 2924/01079* (2013.01); *H01L 2924/01082* (2013.01); *H01L 2924/15153* (2013.01); *H01L 2924/15165* (2013.01); *H01L 2924/15311* (2013.01); *H01L 2924/01005* (2013.01); *H01L 2924/01322* (2013.01); *H01L 2924/014* (2013.01); *H01L 2224/16225* (2013.01); *H01L 2924/13091* (2013.01); *H01L 21/56* (2013.01); *H01L 23/34* (2013.01); *H01L 2224/73265* (2013.01); *H01L 24/18* (2013.01); *H01L 2224/29186* (2013.01); *H01L 2224/2919* (2013.01); *H01L 2924/12041* (2013.01); *H01L 2224/48091* (2013.01); *H01L 2224/48247* (2013.01); *H01L 2224/92244* (2013.01); *H01L 2924/1306* (2013.01)

(56) References Cited

U.S. PATENT DOCUMENTS

| | | | |
|---|---|---|---|
| 5,841,193 A | 11/1998 | Eichelberger | |
| 6,154,366 A | 11/2000 | Ma et al. | |
| 6,238,952 B1 | 5/2001 | Lin | |
| 6,495,914 B1 * | 12/2002 | Sekine et al. | 257/723 |
| 6,563,209 B1 | 5/2003 | Takahashi | |
| 6,683,368 B1 | 1/2004 | Mostafazadeh | |
| 6,713,859 B1 | 3/2004 | Ma | |
| 6,812,552 B2 | 11/2004 | Islam et al. | |
| 6,894,376 B1 | 5/2005 | Mostafazadeh et al. | |
| 7,411,289 B1 | 8/2008 | McLellan et al. | |
| 7,420,266 B2 | 9/2008 | Takahashi | |
| 7,619,901 B2 | 11/2009 | Eichelberger et al. | |
| 7,709,935 B2 | 5/2010 | Islam et al. | |
| 7,858,443 B2 * | 12/2010 | Powell et al. | 438/111 |
| 7,888,184 B2 * | 2/2011 | Shim et al. | 438/122 |
| 7,929,313 B2 | 4/2011 | Ito et al. | |
| 8,072,059 B2 * | 12/2011 | Shim et al. | 257/698 |
| 8,093,711 B2 * | 1/2012 | Zudock et al. | 257/698 |
| 8,138,587 B2 * | 3/2012 | Otremba | 257/676 |
| 8,241,956 B2 * | 8/2012 | Camacho et al. | 438/109 |
| 2004/0164383 A1 * | 8/2004 | Xu | 257/675 |
| 2005/0263864 A1 | 12/2005 | Islam et al. | |
| 2006/0006534 A1 | 1/2006 | Yean et al. | |
| 2007/0158861 A1 | 7/2007 | Huang et al. | |
| 2007/0210423 A1 | 9/2007 | Hsu | |
| 2008/0029855 A1 | 2/2008 | Chang | |
| 2008/0315377 A1 * | 12/2008 | Eichelberger et al. | 257/660 |
| 2009/0091013 A1 | 4/2009 | Fukuda et al. | |
| 2009/0269891 A1 | 10/2009 | Liu et al. | |
| 2009/0309212 A1 * | 12/2009 | Shim et al. | 257/700 |
| 2009/0315170 A1 | 12/2009 | Shim et al. | |
| 2010/0127363 A1 | 5/2010 | Nondhasitthichai et al. | |
| 2010/0140779 A1 * | 6/2010 | Lin et al. | 257/690 |
| 2010/0237477 A1 | 9/2010 | Pagaila et al. | |
| 2010/0237495 A1 * | 9/2010 | Pagaila et al. | 257/700 |
| 2010/0244208 A1 * | 9/2010 | Pagaila et al. | 257/659 |
| 2010/0314741 A1 * | 12/2010 | Lee et al. | 257/687 |
| 2011/0140259 A1 | 6/2011 | Cho et al. | |
| 2011/0215450 A1 | 9/2011 | Chi et al. | |
| 2011/0227208 A1 * | 9/2011 | Kim et al. | 257/676 |
| 2011/0278716 A1 * | 11/2011 | Hsu et al. | 257/737 |

* cited by examiner

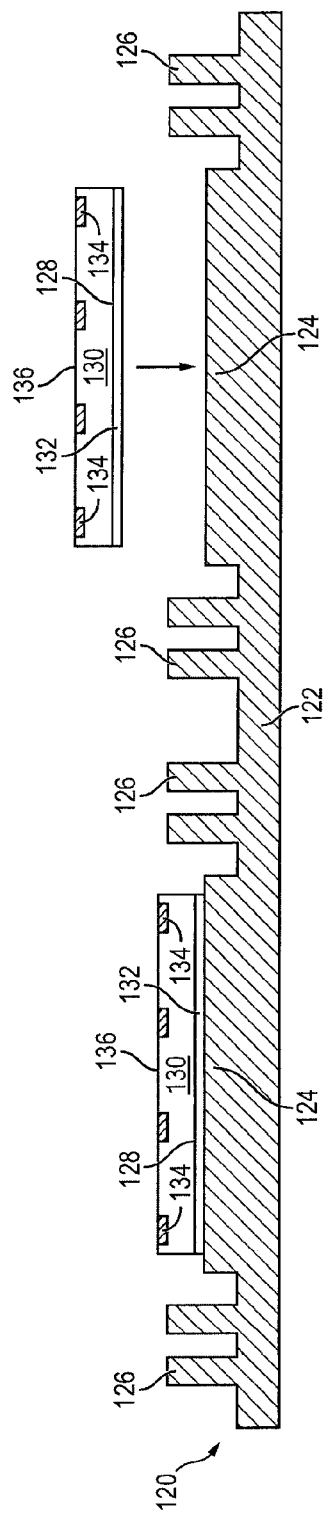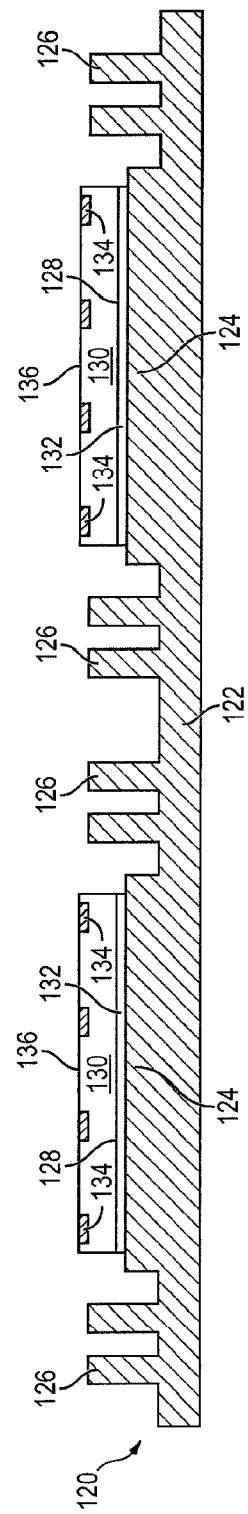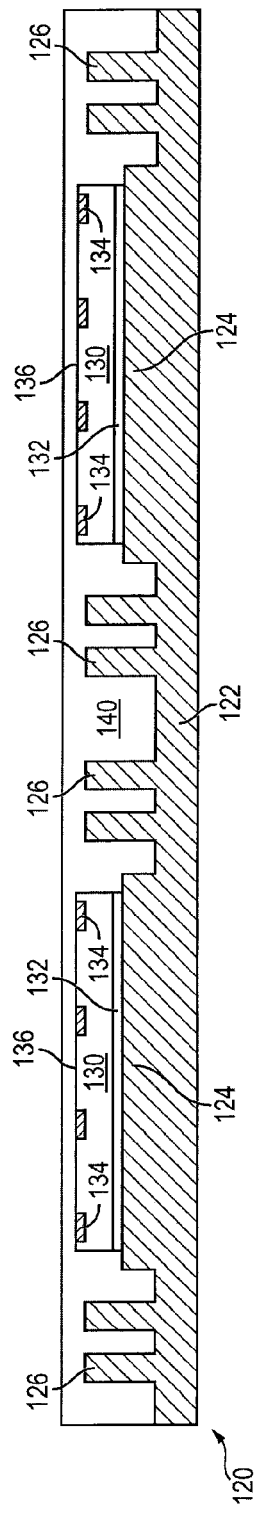

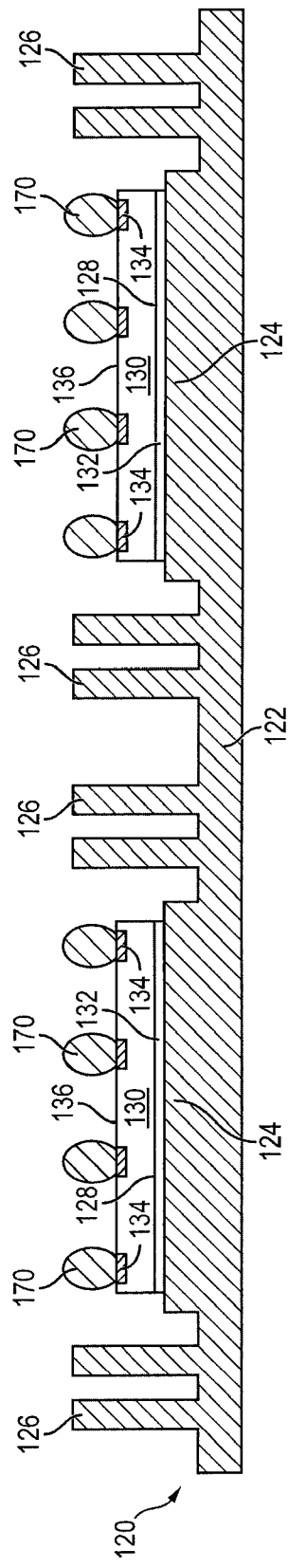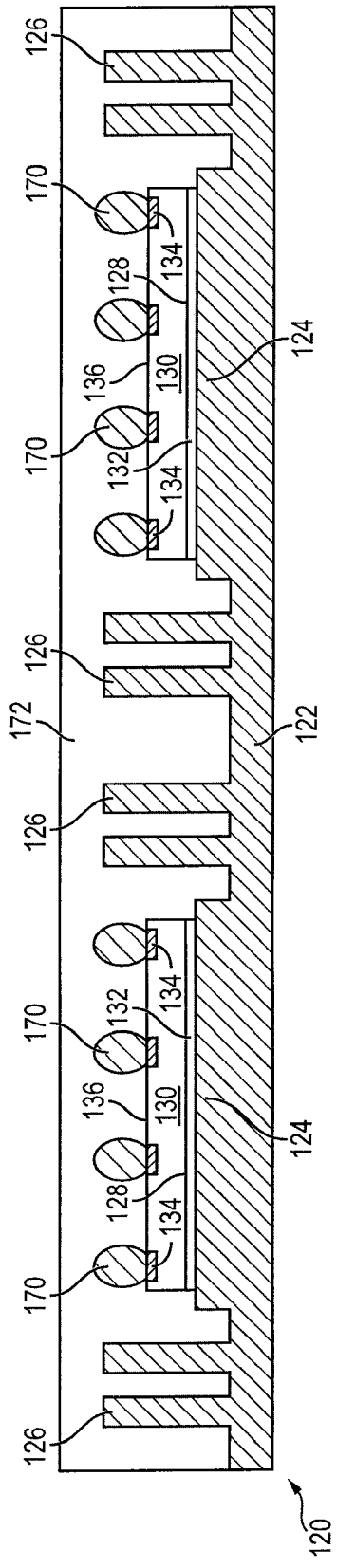

SEMICONDUCTOR DEVICE AND METHOD OF FORMING CONDUCTIVE POSTS AND HEAT SINK OVER SEMICONDUCTOR DIE USING LEADFRAME

CLAIM TO DOMESTIC PRIORITY

The present application is a continuation of U.S. patent application Ser. No. 12/787,973, now U.S. Pat. No. 8,349,658, filed May 26, 2010, which application is incorporated herein by reference.

FIELD OF THE INVENTION

The present invention relates in general to semiconductor devices and, more particularly, to a semiconductor device and method of forming conductive posts around a semiconductor die and heat sink over the semiconductor die using a leadframe having a base with integrated extended bodies and raised die paddle.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

In a fan-out wafer level chip scale package (FO-WLCSP), the vertical electrical interconnection can be accomplished with conductive through silicon vias (TSV), through hole vias (THV), or Cu-plated conductive pillars. Vias are formed in silicon or organic material around the die using mechanical drilling, laser drilling, or deep reactive ion etching (DRIE). The vias are filled with conductive material, for example by copper deposition using an electroplating process, to form the conductive TSVs and THVs. The TSVs and THVs further connect through build-up interconnect structures which are formed across each semiconductor die. The THVs and TSVs often require deep via formation and single or dual interconnect structures for routing signals between the stacked semiconductor die. The formation of deep vias by mechanical drilling, laser drilling, or DRIE is an expensive manufacturing step, which requires specialized equipment.

SUMMARY OF THE INVENTION

A need exists to dissipate heat from a semiconductor die, as well as provide for vertical electrical interconnect. Accordingly, in one embodiment, the present invention is a method of making a semiconductor device comprising the steps of providing a substrate including a raised die area and a plurality of conductive bodies extending from the substrate, disposing a semiconductor die over the raised die area between the conductive bodies of the substrate, depositing an encapsulant over the substrate and semiconductor die, forming an interconnect structure over the encapsulant, and removing a portion of the substrate to separate the conductive bodies from the raised die area. The interconnect structure is electrically connected to the conductive bodies.

In another embodiment, the present invention is a method of making a semiconductor device comprising the steps of providing a prefabricated die area and a plurality of conductive posts, disposing a semiconductor die over the die area and within a height of the conductive posts, and depositing an encapsulant over the semiconductor die and around the conductive posts.

In another embodiment, the present invention is a semiconductor device comprising a die area and plurality of conductive posts. A semiconductor die is disposed over the die area between the conductive posts. An encapsulant is deposited over the semiconductor die and around the conductive posts. An interconnect structure is formed over the encapsulant. The interconnect structure is electrically connected to the conductive posts.

In another embodiment, the present invention is a semiconductor device comprising a die area and plurality of conductive posts. A semiconductor die is disposed over the die area and within a height of the conductive posts. An encapsulant is deposited over the semiconductor die and around the conductive posts.

BRIEF DESCRIPTION OF THE DRAWINGS

FIGS. 3a-3m illustrate a process of forming conductive posts and heat sink over a semiconductor die using a leadframe having a base with integrated extended bodies and raised die paddle;

FIGS. 6a-6f illustrate another process of forming conductive posts extending to interconnect structure and heat sink over a semiconductor die using a leadframe.

DETAILED DESCRIPTION OF THE DRAWINGS

Figure 1:
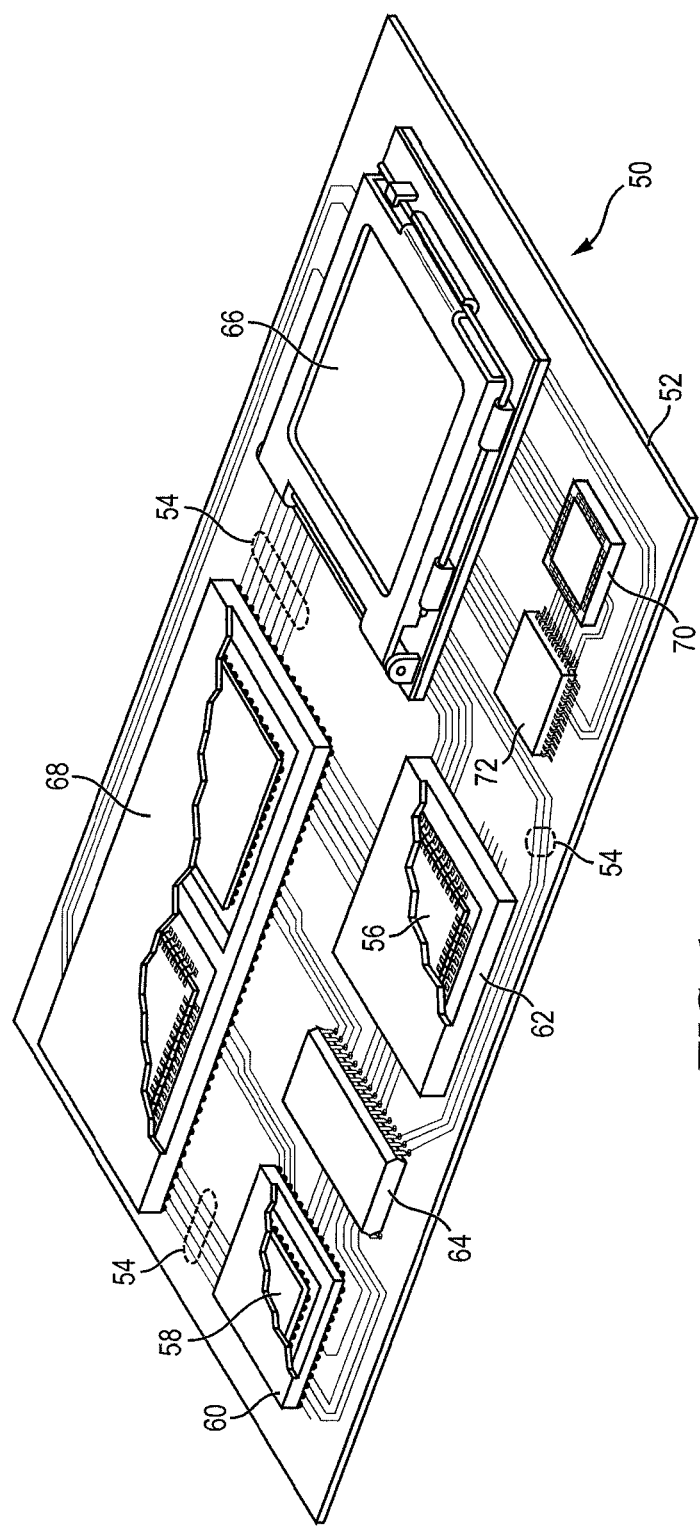
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
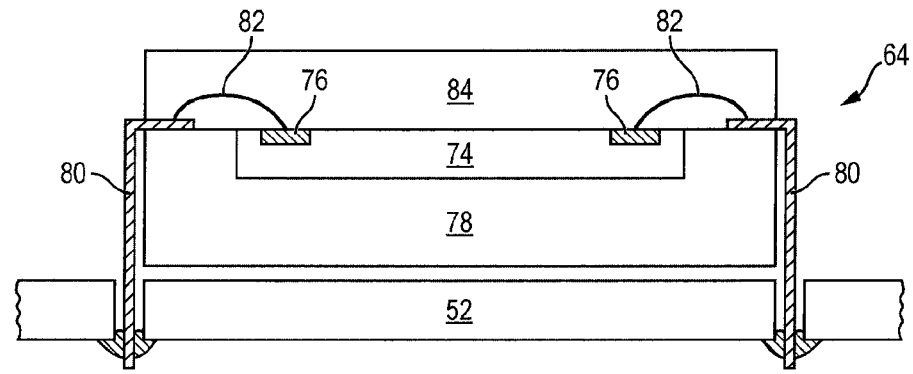
FIGS. 2a-2c illustrate further detail of the representative semiconductor packages mounted to the PCB.
Figure 2B:
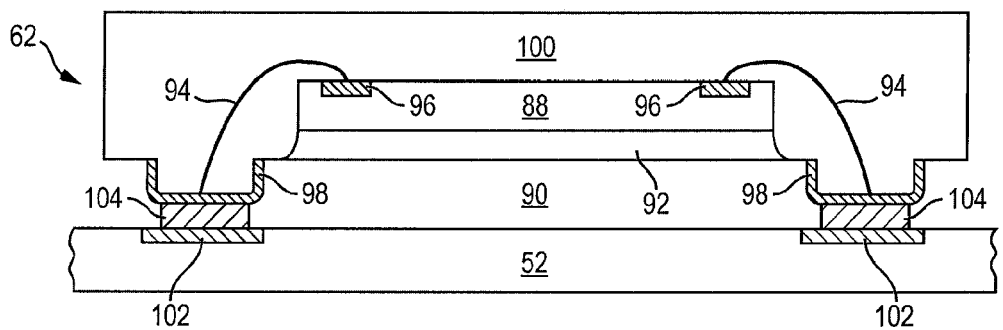
Figure 2C:
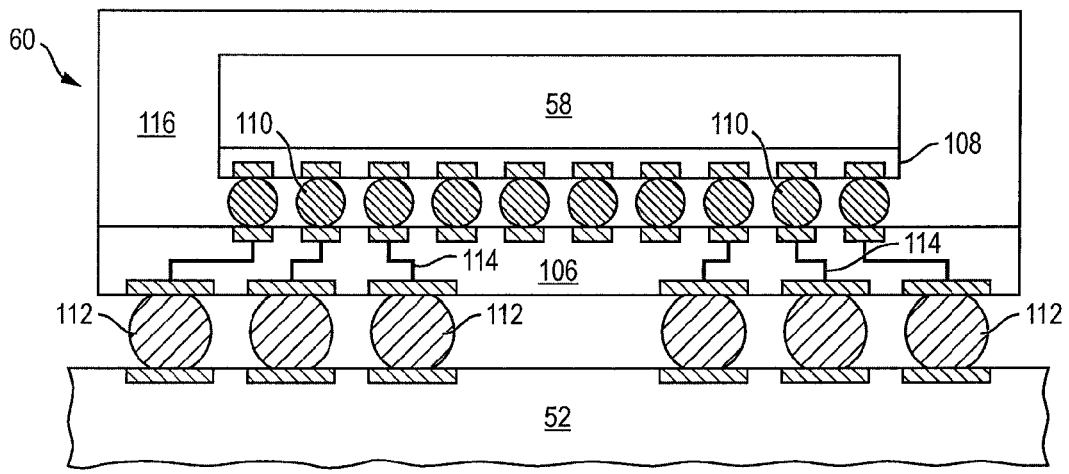

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2*b* illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
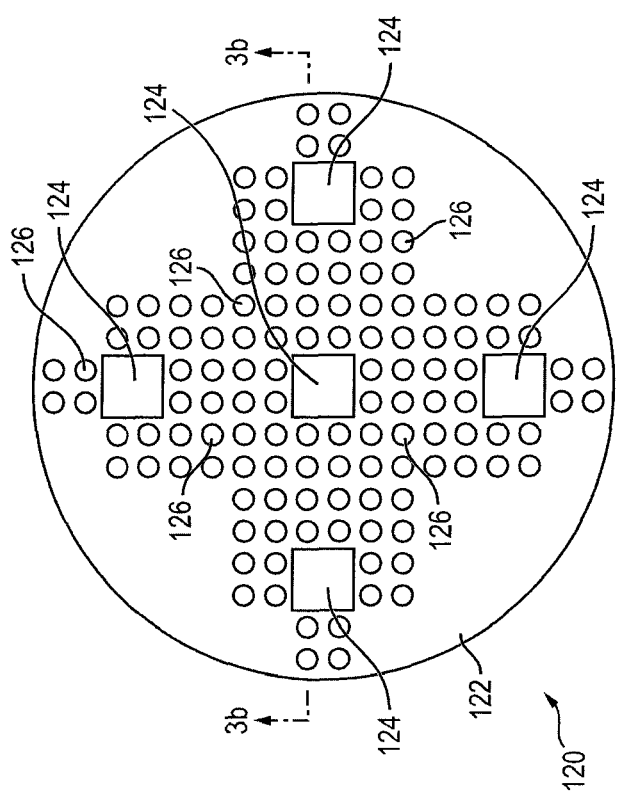
Figure 3B:
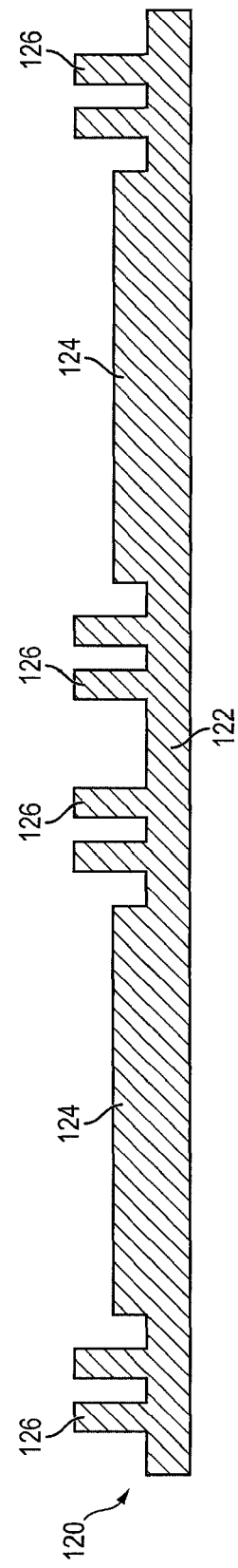

FIGS. 3*a*-3*m* illustrate, in relation to FIGS. 1 and 2*a*-2*c*, a process of forming conductive posts and heat sink over a semiconductor die using a leadframe having a base with integrated extended bodies and raised die paddle. FIG. 3*a* shows a top view of a wafer-form multi-die metal carrier or leadframe 120 adapted for receiving semiconductor die. Leadframe 120 could also be a panel or strip. Leadframe 120 provides structural support and electrical interconnection. In one embodiment, leadframe 120 is an un-singulated pre-molded or prefabricated laminated substrate. Leadframe 120 includes a base 122 with an integrated raised die paddle or stiffener 124 and a plurality of integrated bodies 126 extending from the base. In one embodiment, leadframe 120 is Cu prefabricated using a leadframe manufacturing process to reduce manufacturing costs. Alternatively, leadframe can be Al, Cu alloys, Au, or other material with high thermal conductivity. FIG. 3*b* shows a cross-sectional view of leadframe 120.

In FIG. 3*c*, back surfaces 128 of semiconductor die or components 130 are mounted to raised die paddle 124 of leadframe 120 with thermally conductive die attach adhesive 132. In one embodiment, adhesive 132 is a thermal interface material (TIM), such as aluminum oxide, zinc oxide, boron nitride, or pulverized silver. TIM 132 can be applied to back surface 128 of semiconductor die 130 or to a top surface of raised die paddle 124, prior to mounting the semiconductor die to the raised die paddle. TIM 132 aids in the distribution and dissipation of heat generated by semiconductor die 130.

Semiconductor die 130 has contact pads 134 formed over active surface 136 which is oriented away from leadframe 120. Active surface 136 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 136 to implement analog circuits or digital circuits, such as digital signal processing (DSP), ASIC, memory, or other signal processing circuit. Semiconductor die 130 may also contain IPDs, such as inductors, capacitors, and resistors, for RF signal processing. In one embodiment, semiconductor die 130 is a flipchip type semiconductor die. FIG. 3d shows all semiconductor die 130 mounted to raised die paddle 124 of leadframe 120 between extended bodies 126. The extended bodies 126 have a height that extends to a level below active surface 136.

In FIG. 3e, an encapsulant or molding compound 140 is deposited over leadframe 120 and semiconductor die 130 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive and environmentally protects the semiconductor device from external elements and contaminants.

Figure 3F:
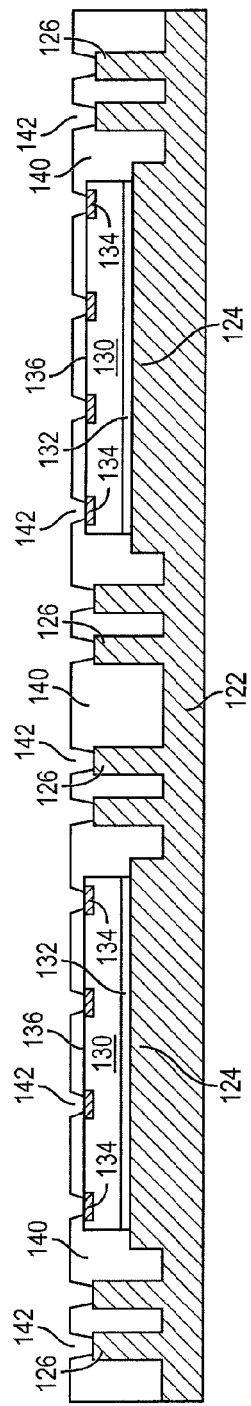

In FIG. 3f, a plurality of vias 142 is formed through encapsulant 140 using an etching process to expose extended bodies 126 and contact pads 134. Vias 142 can also be formed by mechanical drilling or laser ablation.

Figure 3G:
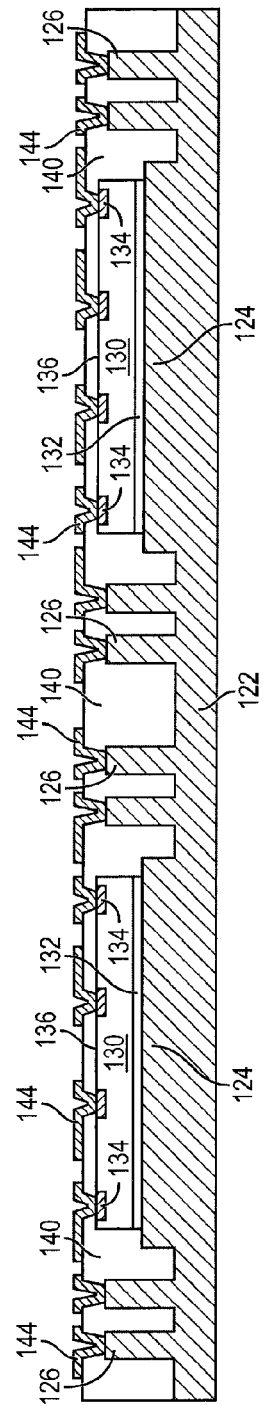

In FIG. 3g, an electrically conductive layer 144 is formed over encapsulant 140 using a patterning and metal deposition process such as sputtering, electrolytic plating, and electroless plating. Conductive layer 144 can be one or more layers of Al, Cu, Sn, Ni, Au, Ag, or other suitable electrically conductive material. Conductive layer 144 follows the contour of encapsulant 144, including into vias 142. One portion of conductive layer 144 is electrically connected to extended bodies 126. Another portion of conductive layer 144 is electrically connected to contact pads 134. Other portions of conductive layer 144 can be electrically common or electrically isolated depending on the design and function of semiconductor die 130.

Figure 3H:
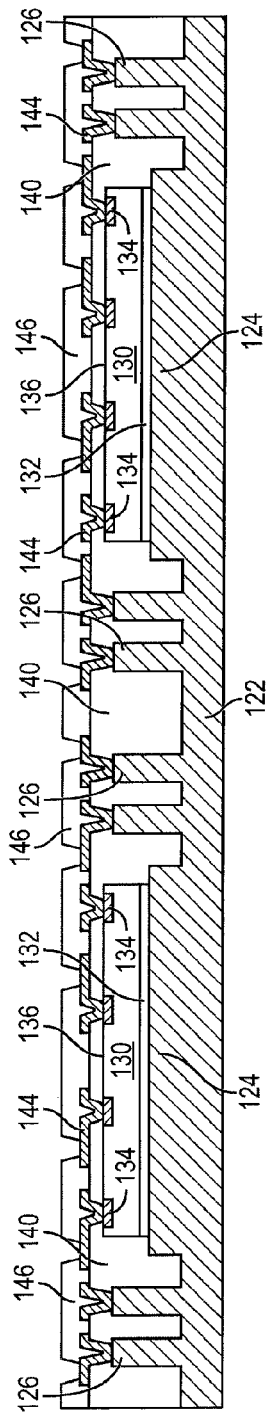

In FIG. 3h, an insulating or passivation layer 146 is formed over conductive layer 144 using PVD, CVD, printing, spin coating, spray coating, sintering or thermal oxidation. The insulating layer 146 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 146 is removed by an etching process or laser ablation to expose conductive layer 144.

Figure 3I:
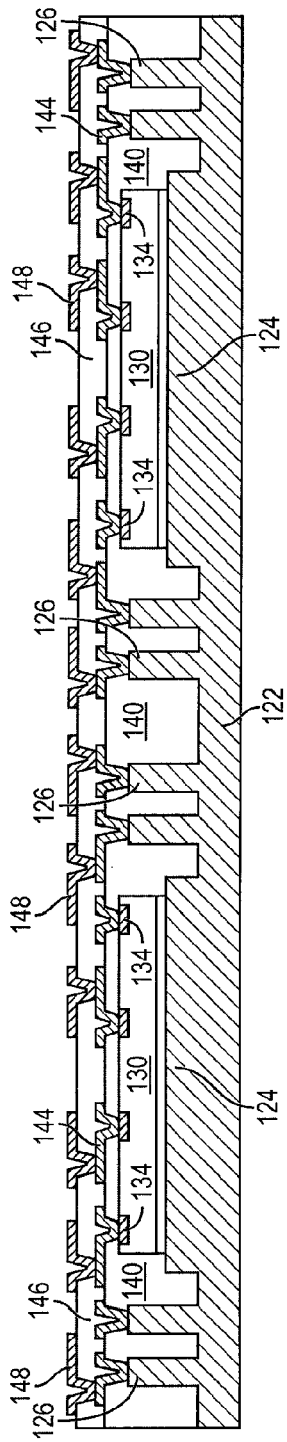

In FIG. 3i, an electrically conductive layer 148 is formed over insulating layer 146 and the exposed conductive layer 144 using a patterning and metal deposition process such as sputtering, electrolytic plating, and electroless plating. Conductive layer 148 can be one or more layers of Al, Cu, Sn, Ni, Au, Ag, or other suitable electrically conductive material. One portion of conductive layer 148 is electrically connected to conductive layer 144. Other portions of conductive layer 148 can be electrically common or electrically isolated depending on the design and function of semiconductor die 130.

Figure 3J:
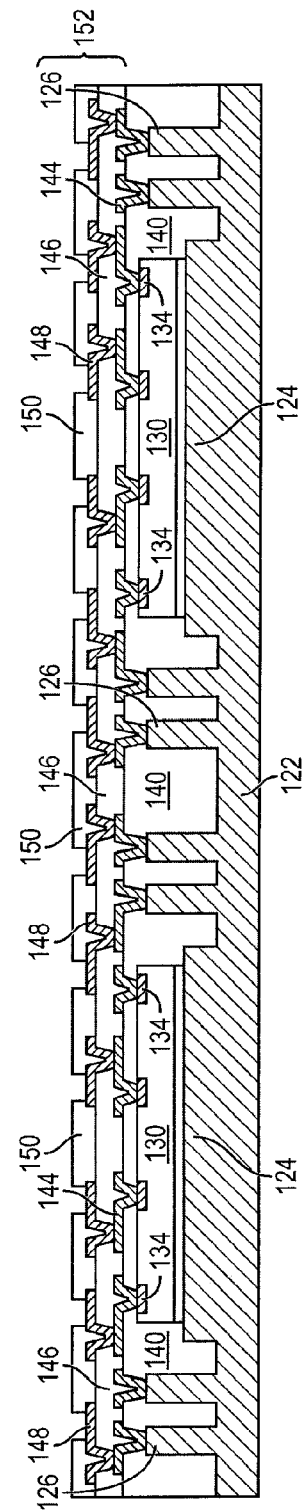

In FIG. 3j, an insulating or passivation layer 150 is formed over insulating layer 146 and conductive layers 148 using PVD, CVD, printing, spin coating, spray coating, sintering or thermal oxidation. The insulating layer 150 contains one or more layers of SiO2, Si3N4, SiON, Ta2O5, Al2O3, or other material having similar insulating and structural properties. A portion of insulating layer 150 is removed by an etching process to expose conductive layer 148. The combination of conductive layers 144 and 148 and insulating layers 146 and 150 constitute build-up interconnect structure 152.

Figure 3K:
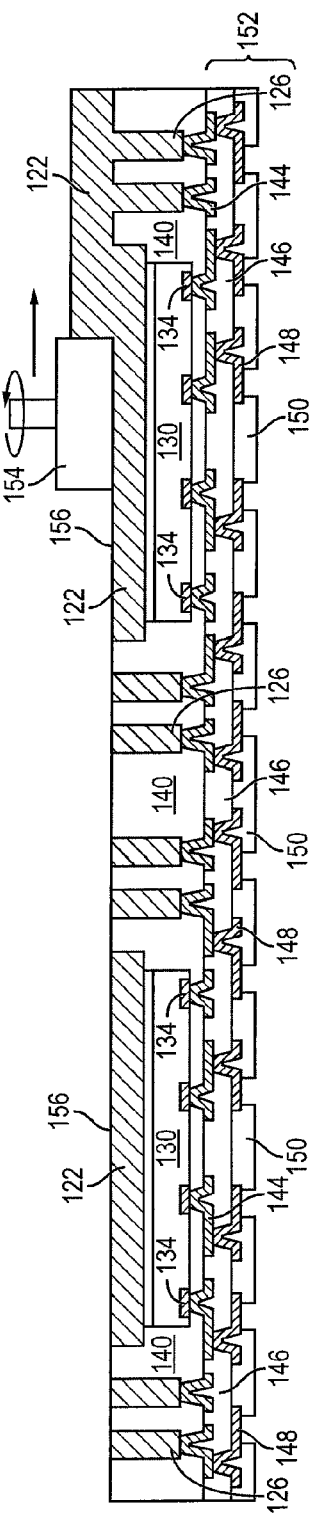
Figure 3L:
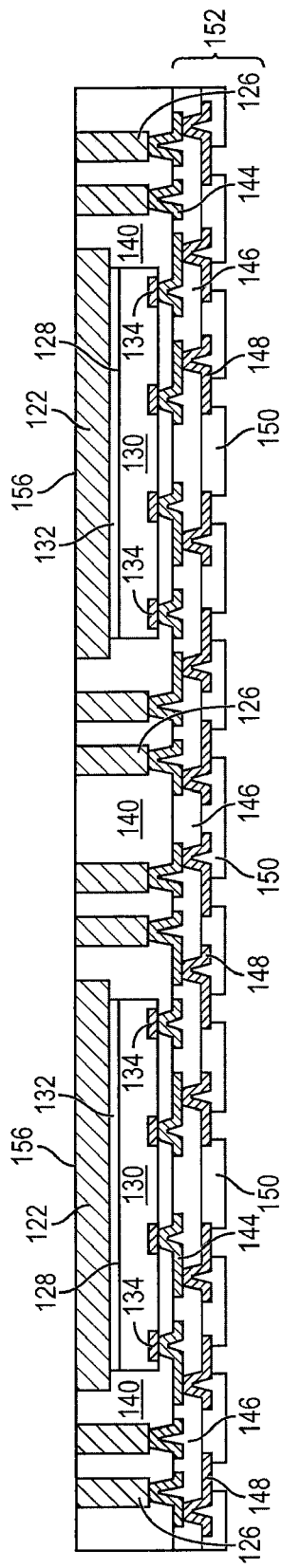

In FIG. 3k, the structure is inverted and base 122 is removed by grinder 154 or chemical etching to expose extended bodies 126 and surface 156 of raised die paddle 124. Following the grinding operation, extended bodies 126 are physically and electrically separated from raised die paddle 124 and function as conductive pillars or posts for additional interconnect and package integration, as shown in FIG. 3l. The raised die paddle 124 operates as a heat sink or heat spreader mounted to back surface 128 of semiconductor die 130 with TIM 132 for distribution and dissipation of heat generated by semiconductor die 130.

Figure 3M:
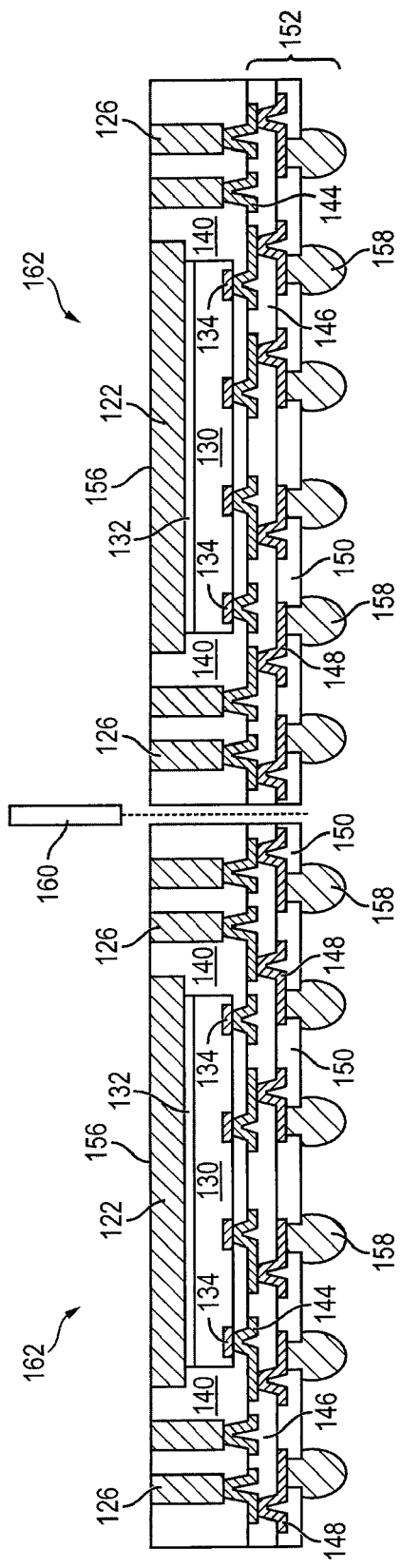

In FIG. 3m, an electrically conductive bump material is deposited over build-up interconnect structure 152 and electrically connected to conductive layers 144 and 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 148 using a suitable attachment or bonding process. In one embodiment, the bump material is reflowed by heating the material above its melting point to form spherical balls or bumps 158. In some applications, bumps 158 are reflowed a second time to improve electrical contact to conductive layer 148. An under bump metallization (UBM) can be formed under bumps 158. The bumps can also be compression bonded to conductive layer 148. Bumps 158 represent one type of interconnect structure that can be formed over conductive layer 148. The interconnect structure can also use bond wires, stud bump, micro bump, or other electrical interconnect.

Figure 4:
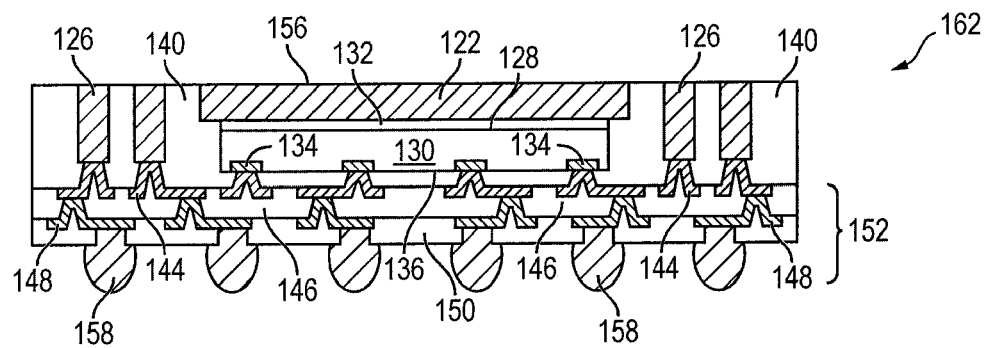
FIG. 4 illustrates a WLCSP with conductive posts and heat sink over a semiconductor die.

Semiconductor die 130 are singulated using saw blade or laser cutting tool 160 into individual FO-WLCSP 162. FIG. 4 shows FO-WLCSP 162 after singulation. Semiconductor die 130 is electrically connected to interconnect structure 152 and conductive pillars or posts 126. Conductive pillars or posts 126 are exposed from encapsulant 140 for additional interconnect and package integration. Leadframe 120 provides stiffness for package integrity and robustness during encapsulation and formation of interconnect structure 152. Following the grinding operation to remove base 122, the raised die paddle 124 becomes a heat sink or heat spreader to dissipate heat generated by semiconductor die 130. The extended bodies 126 become conductive pillars or posts for additional electrical interconnect and package integration.

Figure 5:
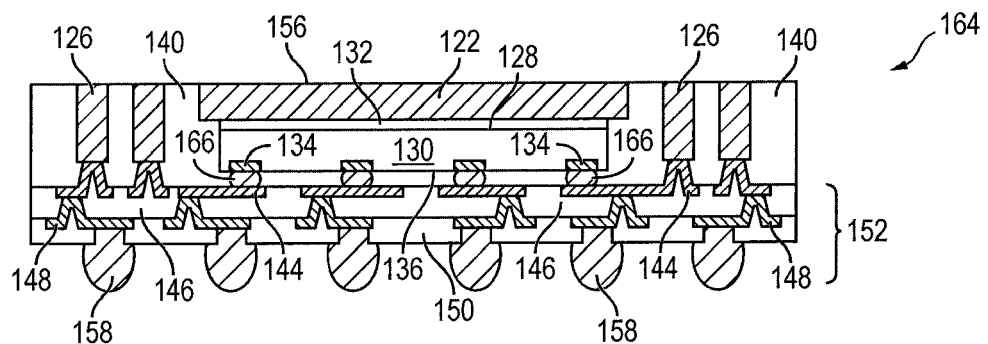
FIG. 5 illustrates the WLCSP with bumps formed over the semiconductor die.

FIG. 5 shows another embodiment of FO-WLCSP 164, similar to FIG. 4, with bumps 166 formed over contact pads 134. Bumps 166 are electrically connected to conductive layers 144 and 148 of interconnect structure 152.

Figure 6C:
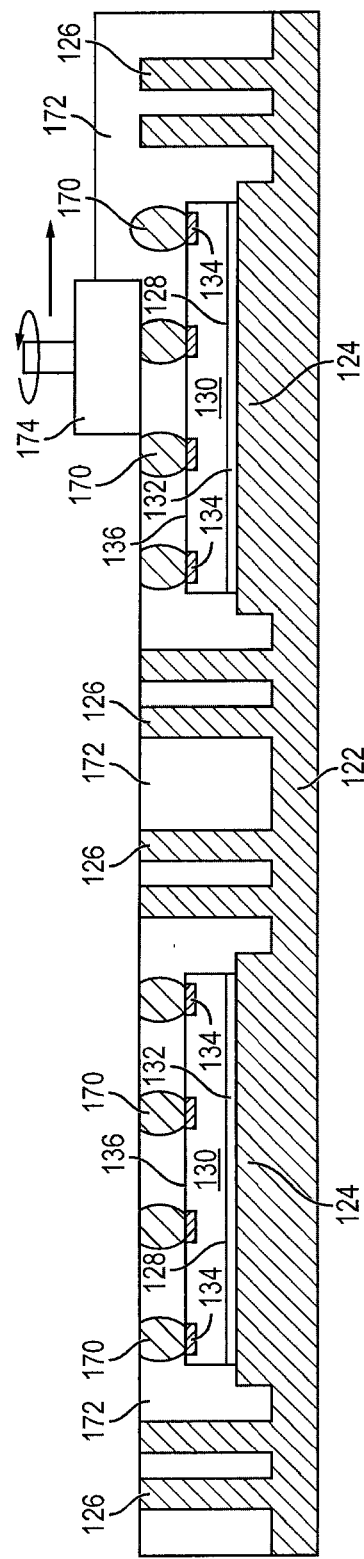

FIGS. 6a-6f show another embodiment, continuing from FIG. 3d, with a plurality of bumps 170 formed over contact pads 134. The extended bodies 126 have a height that extends to bumps 170, as shown in FIG. 6a.

In FIG. 6b, an encapsulant or molding compound 172 is deposited over leadframe 120, semiconductor die 130, and bumps 170 using a paste printing, compressive molding, transfer molding, liquid encapsulant molding, vacuum lamination, spin coating, or other suitable applicator. Encapsulant 172 can be polymer composite material, such as epoxy resin with filler, epoxy acrylate with filler, or polymer with proper filler. Encapsulant 172 is non-conductive and environmentally protects the semiconductor device from external elements and contaminants.

Figure 6D:
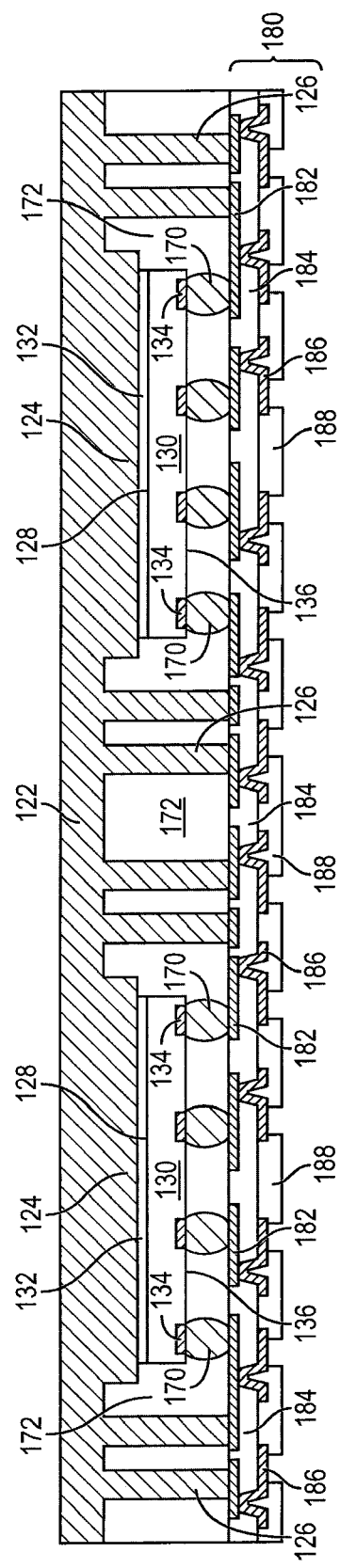

In FIG. 6c, a portion of encapsulant 172 is removed by grinder 174 to expose extended bodies 126 and bumps 170. The structure is inverted and build-up interconnect structure 180 is formed over encapsulant 172, conductive pillars or posts 126, and bumps 170, as shown in FIG. 6d. The interconnect structure 180 includes an electrically conductive layer 182 formed using a patterning and metal deposition process such as sputtering, electrolytic plating, and electroless plating. Conductive layer 182 can be one or more layers of Al, Cu, Sn, Ni, Au, Ag, or other suitable electrically conductive material. One portion of conductive layer 182 is electrically connected to conductive pillars or posts 126. Another portion of conductive layer 182 is electrically connected to bumps 170. Other portions of conductive layer 182 can be electrically common or electrically isolated depending on the design and function of semiconductor die 130.

An insulating or passivation layer 184 is formed over conductive layer 182 using PVD, CVD, printing, spin coating, spray coating, sintering or thermal oxidation. The insulating layer 184 contains one or more layers of SiO2, Si3N4, SiON, Ta2O5, Al2O3, or other material having similar insulating and structural properties. A portion of insulating layer 184 is removed by an etching process to expose conductive layer 182.

An electrically conductive layer 186 is formed over insulating layer 184 and the exposed conductive layer 182 using a patterning and metal deposition process such as sputtering, electrolytic plating, and electroless plating. Conductive layer 186 can be one or more layers of Al, Cu, Sn, Ni, Au, Ag, or other suitable electrically conductive material. One portion of conductive layer 186 is electrically connected to conductive layer 182. Other portions of conductive layer 186 can be electrically common or electrically isolated depending on the design and function of semiconductor die 130.

An insulating or passivation layer 188 is formed over insulating layer 184 and conductive layers 186 using PVD, CVD, printing, spin coating, spray coating, sintering or thermal oxidation. The insulating layer 188 contains one or more layers of SiO2, Si3N4, SiON, Ta2O5, Al2O3, or other material having similar insulating and structural properties. A portion of insulating layer 188 is removed by an etching process to expose conductive layer 186. The combination of conductive layers 182 and 186 and insulating layers 184 and 188 constitute build-up interconnect structure 180.

Figure 6E:
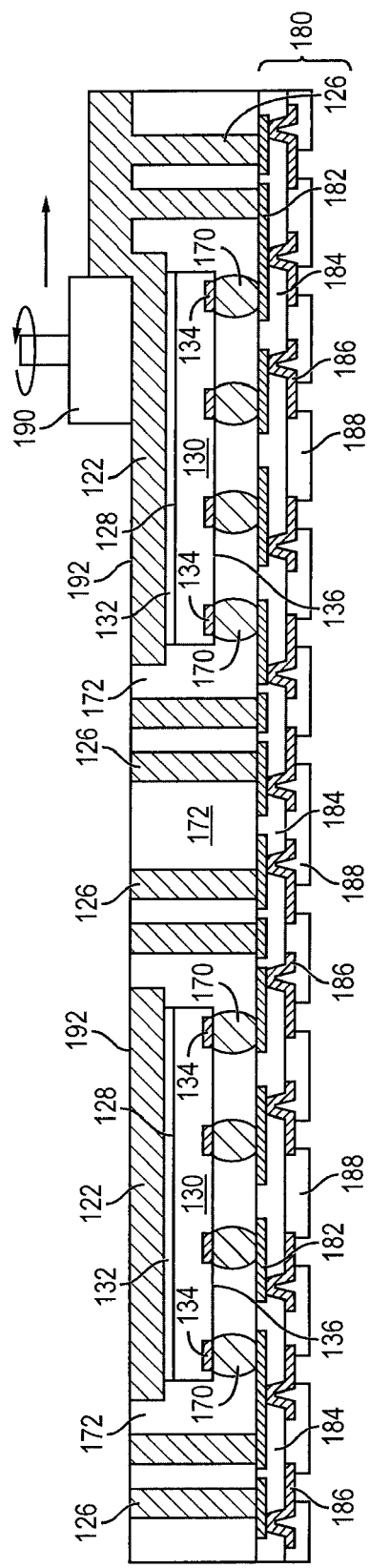

In FIG. 6e, base 122 is removed by grinder 190 or chemical etching to expose extended bodies 126 and surface 192 of raised die paddle 124. Following the grinding operation, extended bodies 126 are physically and electrically separated from raised die paddle 124 and function as conductive pillars or posts for additional interconnect and package integration. Conductive pillars or posts 126 extend completely through encapsulant 172 to conductive layer 182 of interconnect structure 180, which eliminates the need to form vias 142, as described in FIG. 3f. The raised die paddle 124 operates as a heat sink or heat spreader mounted to back surface 128 of semiconductor die 130 with TIM 132 for distribution and dissipation of heat generated by semiconductor die 130.

Figure 6F:
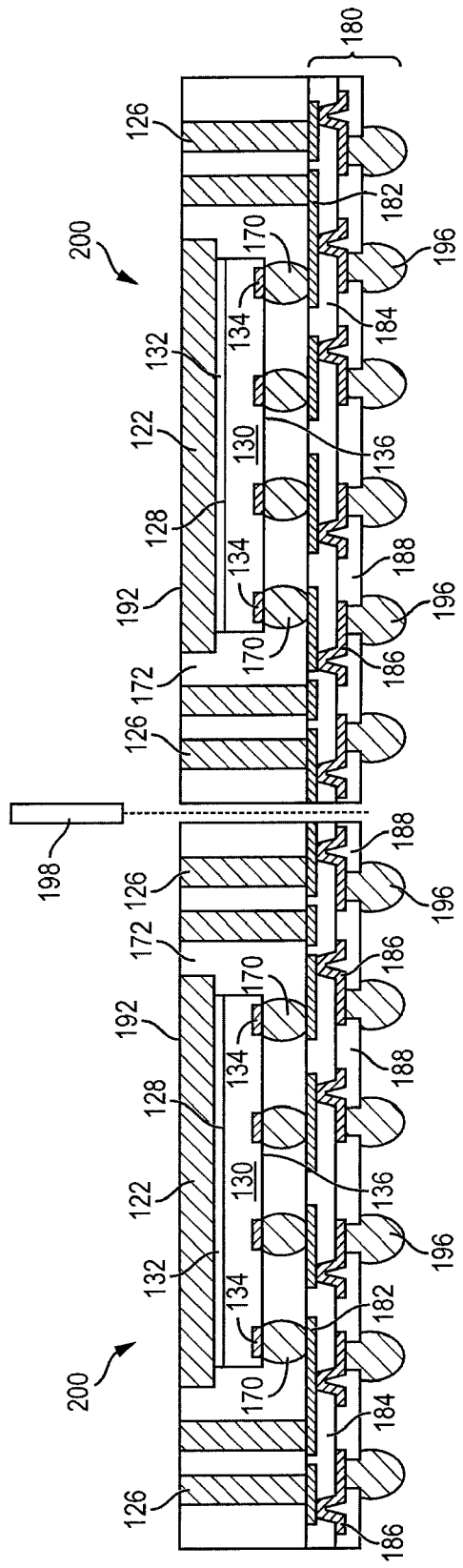

In FIG. 6f, an electrically conductive bump material is deposited over build-up interconnect structure 180 and electrically connected to conductive layers 182 and 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 196. In some applications, bumps 196 are reflowed a second time to improve electrical contact to conductive layer 186. A UBM can be formed under bumps 196. The bumps can also be compression bonded to conductive layer 186. Bumps 196 represent one type of interconnect structure that can be formed over conductive layer 186. The interconnect structure can also use bond wires, stud bump, micro bump, or other electrical interconnect.

Figure 7:
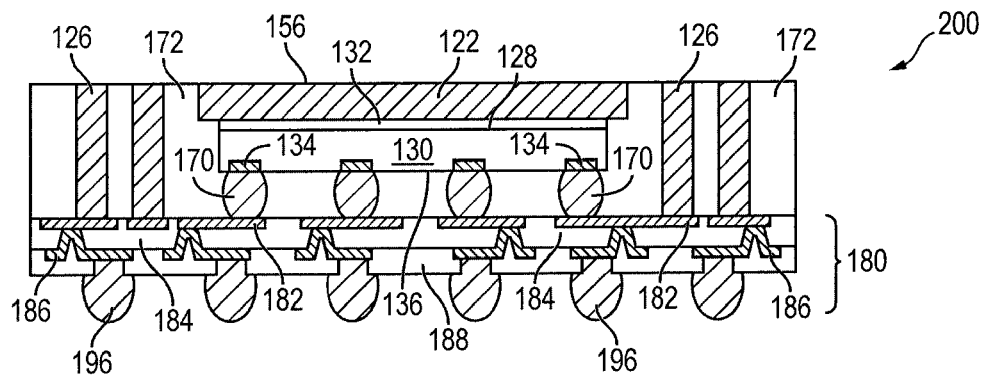
FIG. 7 illustrates the WLCSP with conductive posts extending to interconnect structure and heat sink over a semiconductor die.

Semiconductor die 130 are singulated using saw blade or laser cutting tool 198 into individual FO-WLCSP 200. FIG. 7 shows FO-WLCSP 200 after singulation. Semiconductor die 130 is electrically connected to interconnect structure 180 and conductive pillars or posts 126. Conductive pillars or posts 126 are exposed from encapsulant 172 for additional interconnect and package integration. Leadframe 120 provides stiffness for package integrity and robustness during encapsulation and formation of interconnect structure 180. Following the grinding operation to remove base 122, the raised die paddle 124 becomes a heat sink or heat spreader to dissipate heat generated by semiconductor die 130. The extended bodies 126 become conductive pillars or posts for additional electrical interconnect and package integration.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a substrate including a raised die area extending from a surface of the substrate and a plurality of conductive bodies comprising a height greater than a height of the raised die area;
   disposing a semiconductor die over the raised die area between the conductive bodies of the substrate;
   depositing an encapsulant over the substrate and a surface of the semiconductor die opposite the raised die area;
   forming an interconnect structure over the encapsulant;
   removing a portion of the substrate to separate the conductive bodies from the raised die area; and
   singulating through the encapsulant.

2. The method of claim 1, wherein the raised die area provides heat dissipation for the semiconductor die.

3. The method of claim 1, further including disposing a thermal interface material between the semiconductor die and raised die area.

4. The method of claim 1, further including forming a plurality of bumps over the semiconductor die.

5. The method of claim 1, further including:

forming a plurality of vias in the encapsulant extending to the conductive bodies; and forming a conductive layer over the encapsulant and into the vias.

6. The method of claim 1, further including planarizing the encapsulant to the conductive bodies.

7. A method of making a semiconductor device, comprising:

providing a substrate including a raised die area extending from a surface of the substrate and a plurality of conductive posts comprising a height greater than a height of the raised die area;

disposing a semiconductor die over the raised die area;

depositing an encapsulant over and around the semiconductor die and conductive posts;

forming a plurality of vias in the encapsulant over the conductive posts; and forming a conductive layer over the encapsulant and extending into the vias.

8. The method of claim 7, further including forming an interconnect structure over the semiconductor die.

9. The method of claim 7, wherein the raised die area provides heat dissipation for the semiconductor die.

10. The method of claim 7, further including disposing a thermal interface material between the semiconductor die and raised die area.

11. The method of claim 7, further including forming a plurality of bumps over the semiconductor die.

12. The method of claim 7, further including removing a portion of the substrate to separate the raised die area from the conductive posts.

13. A semiconductor device, comprising:

a die support;

a semiconductor die disposed over the die support and electrically isolated from the die support;

an encapsulant deposited over the semiconductor die including along a sidewall of the die support;

an interconnect structure formed over the encapsulant and semiconductor die; and a conductive post extending from the interconnect structure to a first surface of the encapsulant opposite the interconnect structure.

14. The semiconductor device of claim 13, wherein the die support provides heat dissipation for the semiconductor die.

15. The semiconductor device of claim 13, further including a thermal interface material disposed between the semiconductor die and die support.

16. The semiconductor device of claim 13, further including a plurality of bumps formed over the semiconductor die.

17. The semiconductor device of claim 13, wherein the interconnect structure includes a conductive layer.

18. The semiconductor device of claim 13, wherein a second surface of the encapsulant opposite the first surface of the encapsulant is planar with the conductive post.

19. The semiconductor device of claim 13, wherein the interconnect structure extends into a via formed in the encapsulant over the conductive post.

20. A semiconductor device, comprising:

a die support;

a semiconductor die disposed over a raised surface of the die support;

a conductive post extending above the raised surface of the die support and disposed adjacent to the semiconductor die; and an encapsulant deposited over a surface of the semiconductor die opposite the die support and along a sidewall of the die support.

21. The semiconductor device of claim 20, further including a substrate disposed over the semiconductor die, wherein the die support and conductive post extend from a surface of the substrate.

22. The semiconductor device of claim 20, further including an interconnect structure formed over the encapsulant.

23. The semiconductor device of claim 20, wherein the die support provides heat dissipation for the semiconductor die.

24. The semiconductor device of claim 20, further including a thermal interface material disposed between the semiconductor die and die support.

25. The semiconductor device of claim 20, further including a plurality of bumps formed over the semiconductor die.

26. The semiconductor device of claim 20, wherein the die support is electrically isolated from semiconductor die and conductive post.

* * * * *